(12) United States Patent
Kageyama et al.

(10) Patent No.: US 6,703,768 B2
(45) Date of Patent: Mar. 9, 2004

(54) PIEZOELECTRIC GENERATOR AND MOUNTING STRUCTURE THEREFOR

(75) Inventors: Noboru Kageyama, Higashimurayama (JP); Hisao Wakabayashi, Tokorozawa (JP); Kiyoshi Shimizu, Tokyo (JP); Atsushi Omura, Tokyo (JP)

(73) Assignee: Citizen Watch Co., Ltd., Tokyo (JP)

( * ) Notice: Subject to any disclaimer, the term of this patent is extended or adjusted under 35 U.S.C. 154(b) by 0 days.

(21) Appl. No.: 09/960,412

(22) Filed: Sep. 24, 2001

(65) Prior Publication Data

US 2002/0036448 A1 Mar. 28, 2002

(30) Foreign Application Priority Data

Sep. 27, 2000 (JP) ......................... 2000/293676

(51) Int. Cl.[7] ............................................ H01L 41/08
(52) U.S. Cl. .................................. 310/344; 310/313 R
(58) Field of Search ....................... 310/313 A, 344, 310/348, 340

(56) References Cited

U.S. PATENT DOCUMENTS

| | | | | |
|---|---|---|---|---|
| 4,750,246 A | * | 6/1988 | Pollard | .................... 310/344 X |
| 5,471,722 A | * | 12/1995 | Yatsuda | |
| 5,500,628 A | * | 3/1996 | Knecht | .................... 310/348 X |
| 5,818,145 A | * | 10/1998 | Fukiharu | ................. 310/313 R |
| 6,011,693 A | * | 1/2000 | Gore | ............................ 361/760 |
| 6,049,256 A | * | 4/2000 | Fry | ......................... 310/344 X |
| 6,229,249 B1 | * | 5/2001 | Hatanaka et al. | ........... 310/348 |

FOREIGN PATENT DOCUMENTS

| | | | |
|---|---|---|---|
| JP | 09005105 | 1/1997 | |
| JP | 09167918 | 6/1997 | |
| JP | 10098151 | 4/1998 | |
| JP | 11-308052 | * 5/1999 | ................. 310/344 |
| JP | 2000252747 | 9/2000 | |
| JP | 2000269741 | 9/2000 | |

* cited by examiner

*Primary Examiner*—Mark Budd
(74) *Attorney, Agent, or Firm*—Smith, Gambrell & Russell, LLP (57) ABSTRACT

A crystal oscillator is mounted on a ceramic substrate so that the crystal oscillator is sealed air tight. The peripheral portion of the lower surface of the substrate is provided with electrodes for external connection that project downward from the lower surface of the substrate. An electronic component is mounted on the lower surface of the substrate.

18 Claims, 13 Drawing Sheets

PIEZOELECTRIC GENERATOR AND MOUNTING STRUCTURE THEREFOR

BACKGROUND OF THE INVENTION

1. Field of the Invention

The present invention relates to a piezoelectric generator mounted with a crystal oscillator for obtaining reference signals for the control of radio communication apparatuses, portable telephones, pagers, cordless telephones, audiovisual apparatuses, etc.

2. Description of the Prior Art

In piezoelectric generators that are used in the field of mobile radio communication such as radio communication apparatuses, portable telephones, etc., a crystal oscillator and an electronic component (active element) for its oscillation are stored in a container, in general.

With the oscillation element and the electronic component thus stored in one container, an organic substance from a resin-based adhesive that is used to fix the electronic component may adhere to the oscillation element, thereby lowering its oscillation properties.

Figure 1A:
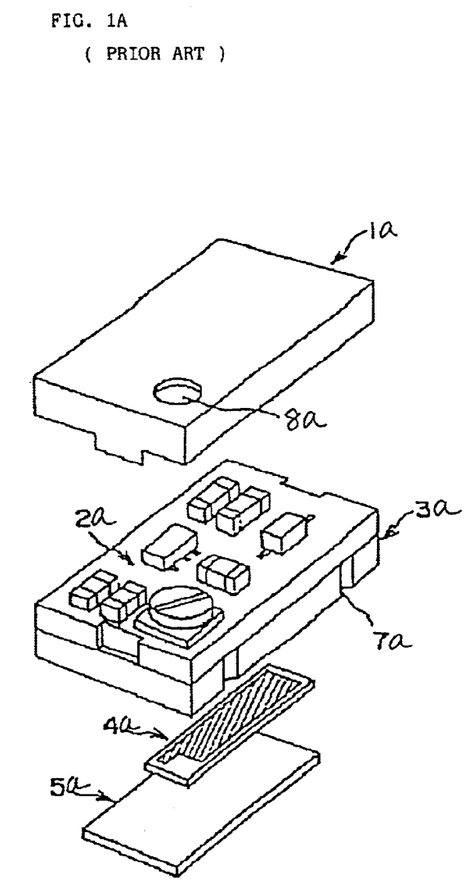
FIG. 1A is an exploded perspective view of a prior art piezoelectric generator.
Figure 1B:
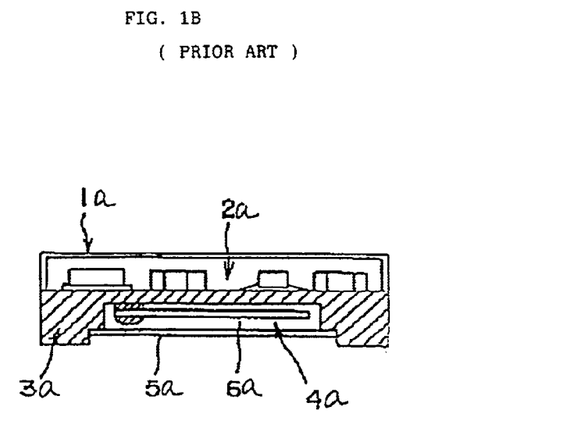
FIG. 1B is a sectional view of the piezoelectric generator of FIG. 1A.

An example of prior art which solves this problem is explained below with reference to FIGS. 1A and 1B.

An oscillator sealing chamber 6a is provided on one side of a multi-layer ceramic substrate 3a, and a crystal oscillator plate 4a is placed in the sealing chamber 6a and hermetically sealed by means of a lid 5a. Printed patterns and circuit elements 2a that form a generator circuit are arranged on the other side of the multi-layer ceramic substrate 3a or on the side opposite to the oscillator chamber 6a, and are covered by means of a casing 1a that has an adjusting hole 8a. Thereupon, a generator is formed. This generator is mounted on a motherboard by means of reflow electrodes 7a that are provided on a side face of the ceramic substrate 3a.

In the generator described above, the oscillation element is first mounted in the chamber on the one side and subjected to frequency regulation, and its opening is then sealed. Then, an electronic component is mounted on the other side and loaded with temperature compensation data. However, a mounting surface that carries the electronic component thereon is exposed in the upper surface. In case where the mounted electronic component is damaged, therefore, the previously mounted oscillation element, as well as the electronic component, have to be scrapped together with the container, so that the cost increases. Thus, in order to make the electronic component inaccessible, it has to be concealed with a casing.

To deal with the problem, proposed is a generator that is designed so that no organic substance from the resin-based adhesive for the electronic component fixation can adhere to the oscillation element and that the electronic component or oscillation element can be reused as a non-defective if it is damaged. An outline of this generator will now be described with reference to FIGS. 2A and 2B.

Figure 2A:
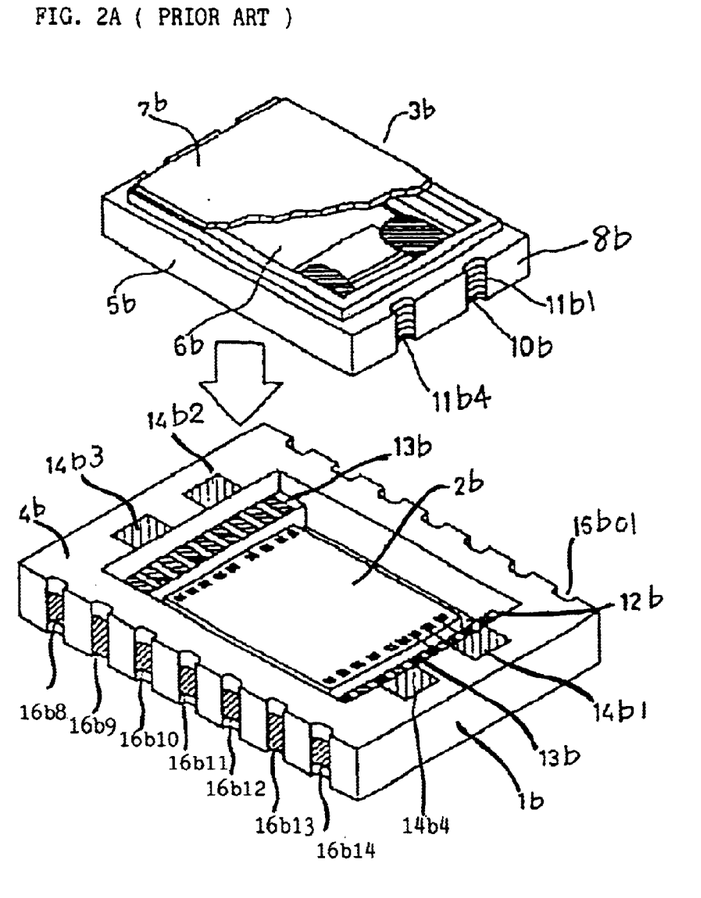
FIG. 2A is an exploded perspective view of another prior art piezoelectric generator.
Figure 2B:
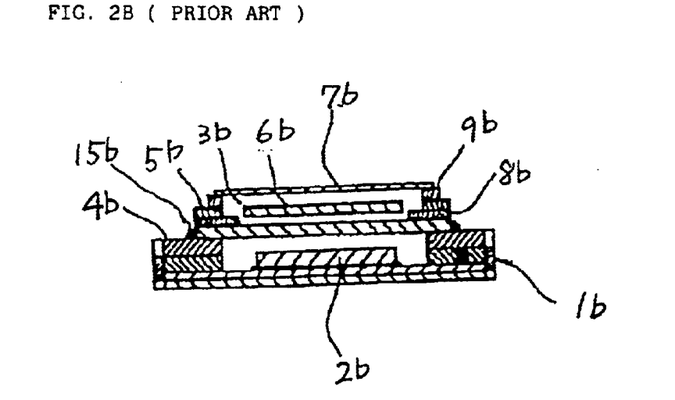
FIG. 2B is a sectional view of the piezoelectric generator of FIG. 2A.

A first container 1b, which is formed of a laminate of ceramic sheets, is molded in the shape of an open-topped box. An active element 2b, an electronic component formed of a bare chip, is fixed in the container 1b with an adhesive.

An oscillation unit 3b is attached to the upper surface of an outer peripheral wall 4b of the first container 1b so as to cover an opening of the container 1b. The oscillation unit 3b, which is formed of a laminate of ceramic sheets, includes an open-topped second container 5b, an oscillation element 6b formed of a crystal oscillator mounted in the second container 5b, and a metallic shielding plate 7b that covers an opening of the second container 5b. By welding the shielding plate 7b to the second container 5b, the oscillator element 6b is hermetically sealed in the second container 5b.

Two semicylindrical notches 10b are formed on each of two opposite sides of an outer peripheral wall 8b of the second container 5b. Second connecting electrodes 11b1 to 11b4 are formed on the respective inner surfaces of the notches 10b and the bottom face continuous therewith (connecting electrodes 11b2 and 11b3, which are located on the back side in FIG. 2A, are not shown). The electrodes 11b1 and 11b3, among the four second connecting electrodes 11b1 to 11b4, are connected electrically to the oscillator element 6b, while the electrodes 11b2 and 11b4 are connected electrically to a seam ring 9b and grounded.

On the other hand, the active element 2b that is mounted on the first container 1b is connected electrically to electrodes 13b by means of wires 12b. First connecting electrodes 14b1 to 14b4, which are connected to any of the electrodes 13b, are provided individually in four positions on the outer peripheral wall of the first container 1b. The first connecting electrodes 14b1, 14b2, 14b3 and 14b4 are connected electrically to the second connecting electrodes 11b1, 11b2, 11b3 and 11b4, respectively, by means of a conductive adhesive material such as solder. Thus, the oscillation 6b and the active element 2b are connected electrically to each other.

After the electrical connection between the first and second electrodes 14b1 to 14b4 and 11b1 to 11b4 is completed, a bond sealing resin 15b is applied to the outer peripheral portion of the bottom face of the second container 5b, whereupon the second container 5b is fixedly bonded to the upper surface of the outer peripheral wall 4b of the first container 1b. Thus, the top opening of the first container 1b is sealed with the second container 5b to protect the active element 2b.

Semicylindrical notches are formed in the outer peripheral surface of the outer peripheral wall 4b of the first container 1b, and electrodes 16b01 to 16b14 are provided in the notches, individually. Among these electrodes, the electrodes 16b02, 16b06, 16b09 and 16b13 are also formed in the bottom face of the first container 1b that are continuous with the notches. The electrodes 16b02, 16b06, 16b09 and 16b13 are an AFC terminal, grounding terminal, oscillation output terminal, and power terminal, respectively. The other electrodes are inspection electrodes, which are situated at a given upward distance from the bottom face of the first container 1b. These electrodes are used for data loading in a memory in the active element 2b and various inspections.

According to the prior art described above, however, the active element and the oscillation element are mounted in the first and second containers, respectively, which are stacked in layers to form a double-deck package, so that the overall thickness of the generator is inevitably great.

Although the electrodes for external connection that are formed in the notches of the outer peripheral wall of the first container and the bottom face thereof are situated at the given upward distance from the bottom face, the distance is very short, and the inspection electrodes are located directly adjacent to them. If the electrodes for external connect are soldered to patterns of the motherboard or the like, solder may flow and cause a short circuit.

SUMMARY OF THE INVENTION

A piezoelectric generator in an aspect of the present invention comprises an oscillator package, including a piezoelectric oscillator sealed in a container and electrodes for external connection formed on the surface of the container, and an electronic component mounted integrally on the oscillator package. The electronic component is mounted on the same surface of the container that carries the electrodes for external connection thereon.

BRIEF DESCRIPTION OF THE DRAWINGS

The above and other features of the invention will be more apparent from the ensuing detailed description with reference to the accompanying drawings, in which.

DETAILED DESCRIPTION OF THE PREFERRED EMBODIMENTS

A first embodiment of the present invention will now be described with reference to FIGS. 3 to 11.

Figure 3:
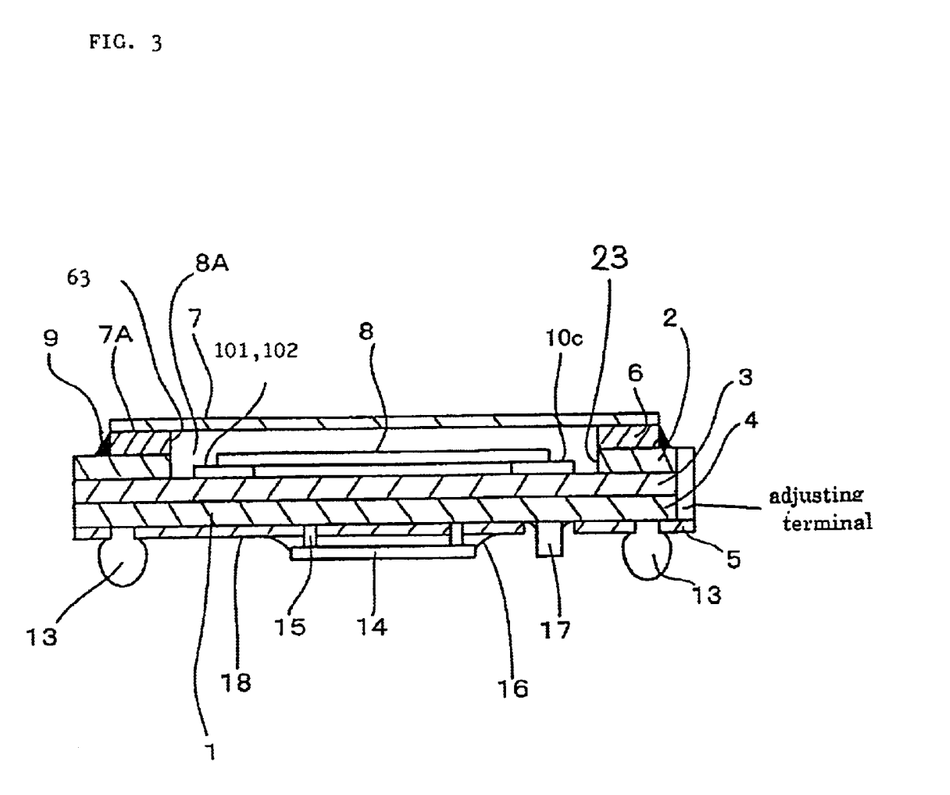
FIG. 3 is a sectional view of a piezoelectric generator according to a first embodiment of the present invention.

As shown in FIG. 3, a multi-layer substrate 1 that constitutes a container is formed of a laminated product of first, second, third, and fourth ceramic sheets 2, 3, 4 and 5 of the same size that have their respective rectangular surfaces. Thus, the multi-layer substrate 1 is a structure of a given thickness that has rectangular surfaces.

Figure 6:
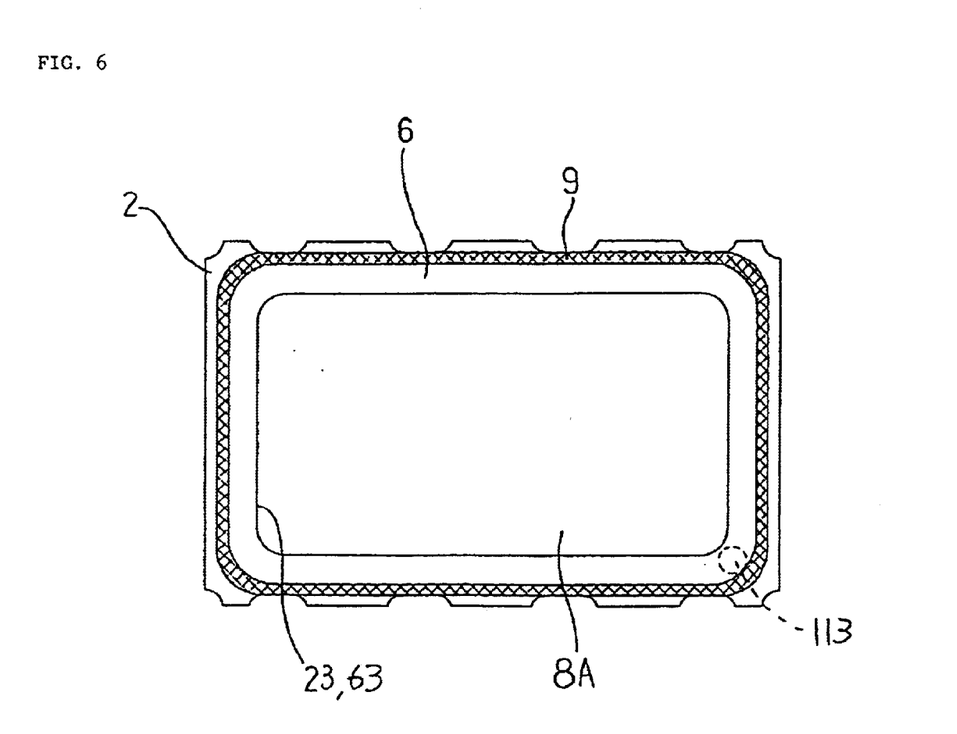
FIG. 6 is a plan view for illustrating the way a seam ring is welded to the upper surface of a first ceramic sheet that constitutes the piezoelectric generator of FIG. 3.

As shown in FIG. 6, the first ceramic sheet 2 has a substantially quadrangular opening 23 that is used to store a crystal oscillator 8 (mentioned later). An Au-plated region is formed on the upper surface of the first ceramic sheet 2, and a seam ring 6 is welded to the Au plating region. The seam ring 6 has an opening 63 that shares the shape with the opening 23 of the first ceramic sheet 2.

As shown in FIG. 3, the opening 23 of the first ceramic sheet 2 and the opening 63 of the seam ring 6 form a storage recess 8A of the crystal oscillator 8. A lid 7 is seamlessly welded to the upper surface of the seam ring 6, whereby the crystal oscillator 8 is hermetically sealed in the storage recess 8A. Further, hermetic sealing that joins using a glass having a low fusing point may be employed in place of such seamless welding.

In FIG. 3, numerals 7A and 9 denote, respectively, a seamless welded surface and a welded joint that is welded to the first ceramic sheet 2 of the seam ring 6.

Figure 7:
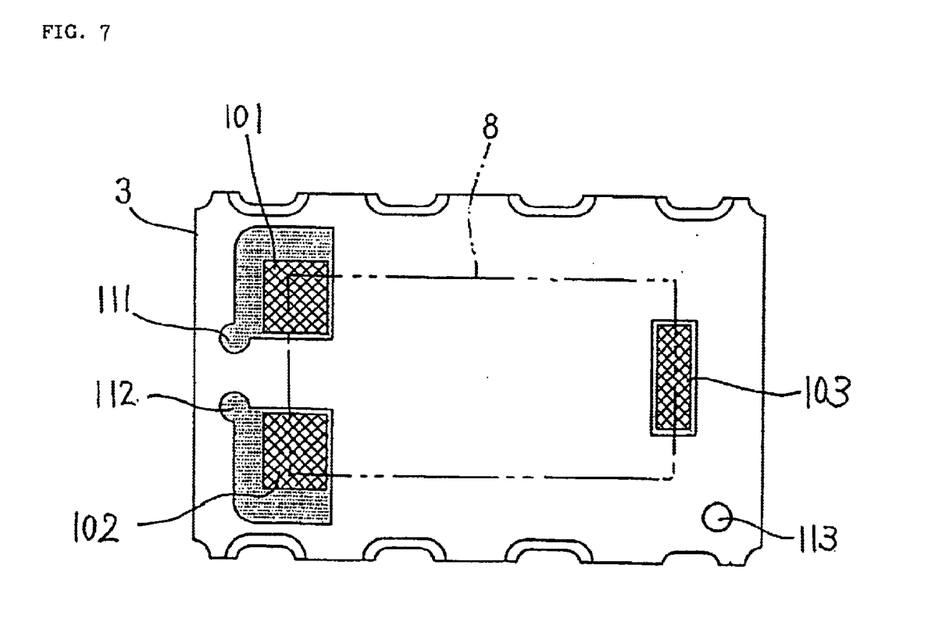
FIG. 7 is a plan view for illustrating the way a crystal oscillator is mounted on the upper surface of a second ceramic sheet that constitutes the piezoelectric generator of FIG. 3.
Figure 8:
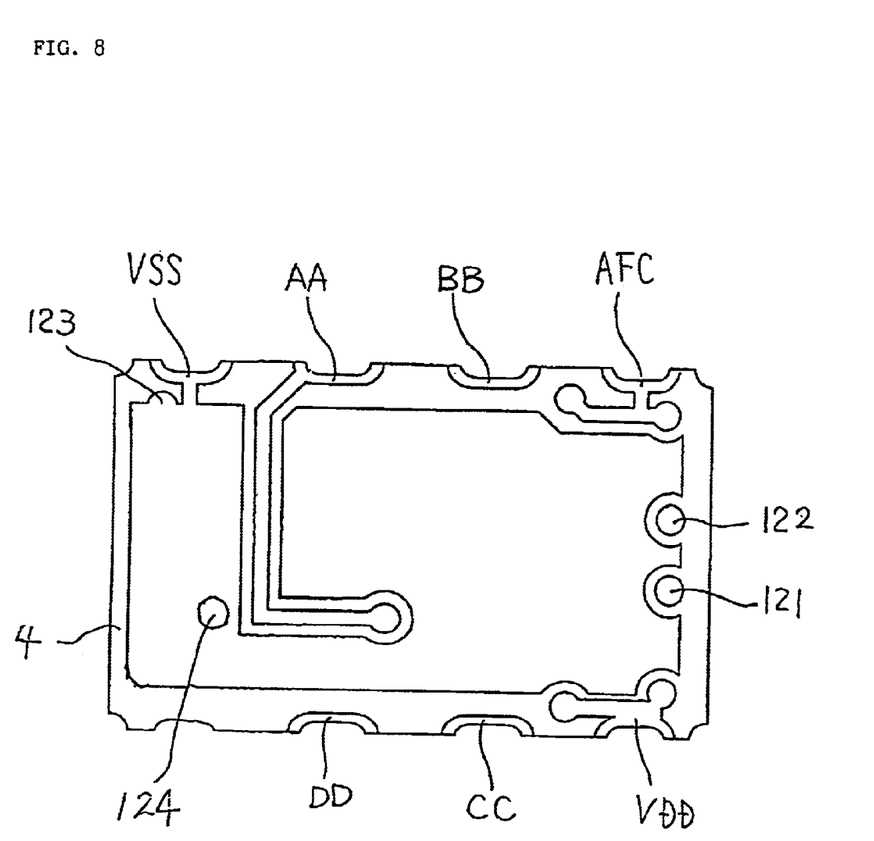
FIG. 8 is a plan view showing electrode patterns formed on the upper surface side of a third ceramic sheet that constitutes the piezoelectric generator of FIG. 3.

As shown in FIG. 7, electrodes 101 and 102 for carrying the crystal oscillator 8 thereon are formed on one end portion of the upper surface of the second ceramic sheet 3. The electrodes 101 and 102 are formed by printing two layers of tungsten electrode film, and their respective upper surfaces are plated with Au. The crystal oscillator 8 is fixed to the respective upper surfaces of the resulting Au deposits with a silicone-based conductive adhesive. Further, a receiving portion 103 for the crystal oscillator 8 is formed on the other end portion of the upper surface of the second ceramic sheet 3. Thus, the crystal oscillator 8 is located in the position indicated by two-dot chain line in FIG. 7, overlying the second ceramic sheet 3. In FIG. 7, numerals 111 and 112 denote through holes (electrodes), which will be mentioned later. The electrodes 101, 102 and the receiving portion 103 maintains a predetermined height, as two layer of tungsten electrode film are printed, so that the crystal oscillator 8 mounted on the upper surface of the electrodes 101, 102 and receiving portion 103 can not come into contact with the second ceramic sheet 3.

Figure 9:
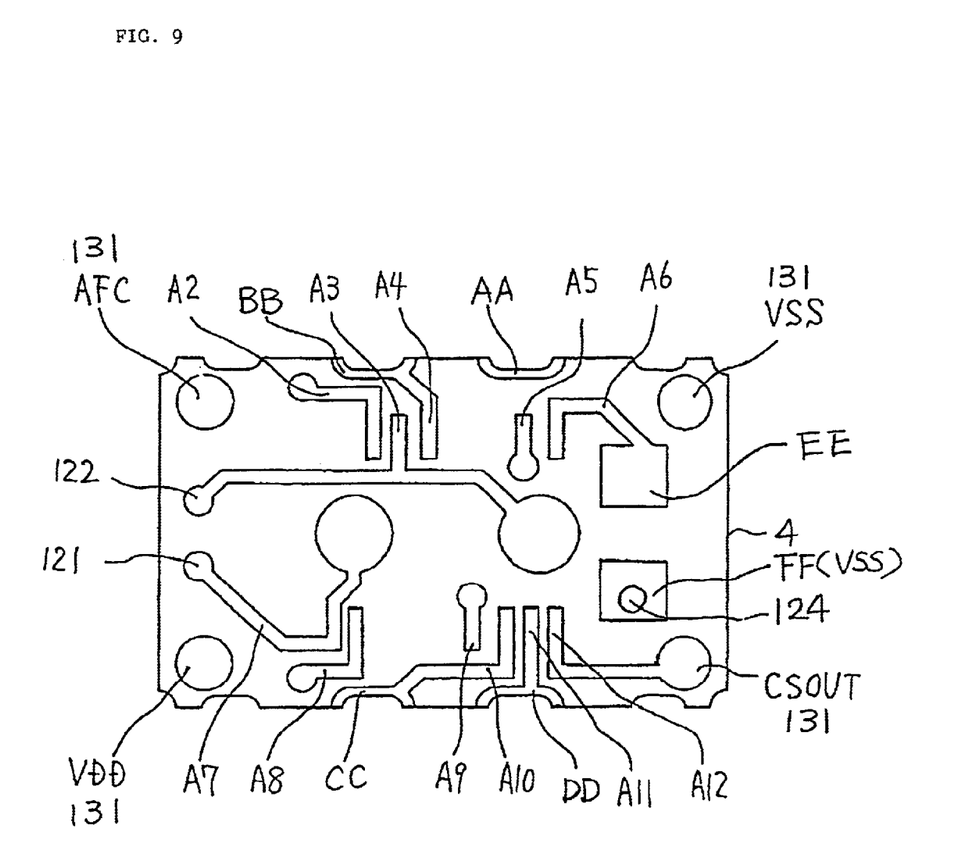
FIG. 9 is a plan view showing electrode patterns formed on the lower surface side of the third ceramic sheet that constitutes the piezoelectric generator of FIG. 3.

As shown in FIG. 9, four terminals 131 that constitute external connecting electrodes are provided individually at the four corners of the lower surface of the third ceramic sheet 4.

A plurality of semicylindrical notches are formed in the outer peripheral wall of the multi-layer substrate 1 (laminated product of the first to fourth ceramic sheets 2 to 5). Various electrode terminals for adjustment are arranged in the notches, individually. The respective functions of the individual terminals will now be described with reference to FIGS. 8 and 9.

An electrode terminal VDD is a positive power terminal, VSS is a negative power terminal, CSOUT is an oscillation waveform output terminal, and AFC is an AFC control voltage connecting terminal for externally applying voltage signals for frequency regulation. These four electrode terminals are terminals a user or purchaser of the generator uses. Three terminals, among these four terminals, excluding CSOUT, are connected to an electrode pattern (FIG. 8) on the upper surface of the third ceramic sheet 4 by means of through holes.

On the other hand, electrode terminals AA, BB, CC and DD are adjusting terminals for temperature compensation data the manufacture of the generator uses. The terminal AA is a clock input terminal, BB is a data output terminal, CC is an output terminal for various analog signals, and DD is a chip select input terminal. XTAL-A (mentioned later) are crystal oscillator connecting terminals (input side). Also, XTAL2 is a crystal oscillator connecting terminal (output side). Although three terminals, among the four terminals (VDD, VSS, CSOUT, AFC) that are used by the user, excluding CSOUT, are also led out on the side faces of the multi-layer substrate 1, they are not used for external connection, and are used for adjustment only.

Figure 4:
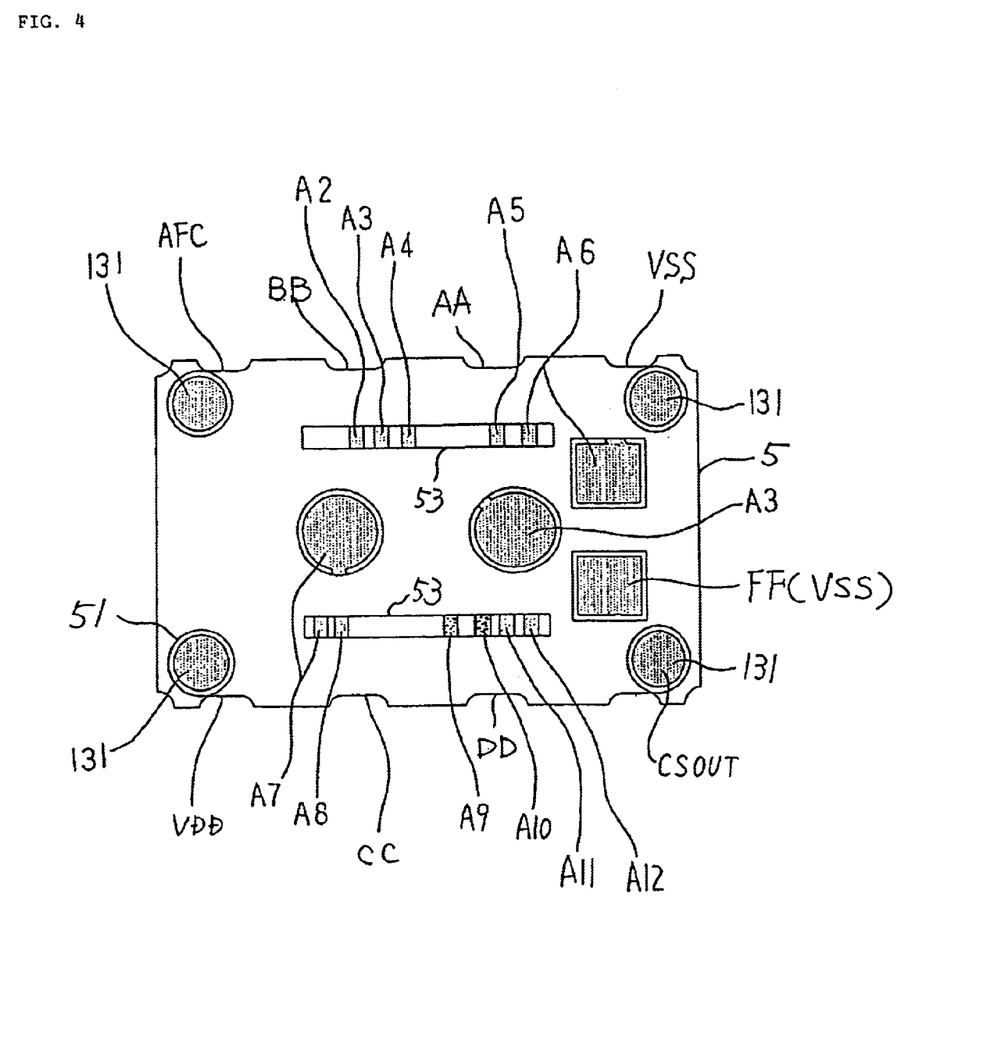
FIG. 4 is a bottom view of the piezoelectric generator (mounted with no electronic component) of FIG. 3.
Figure 11:
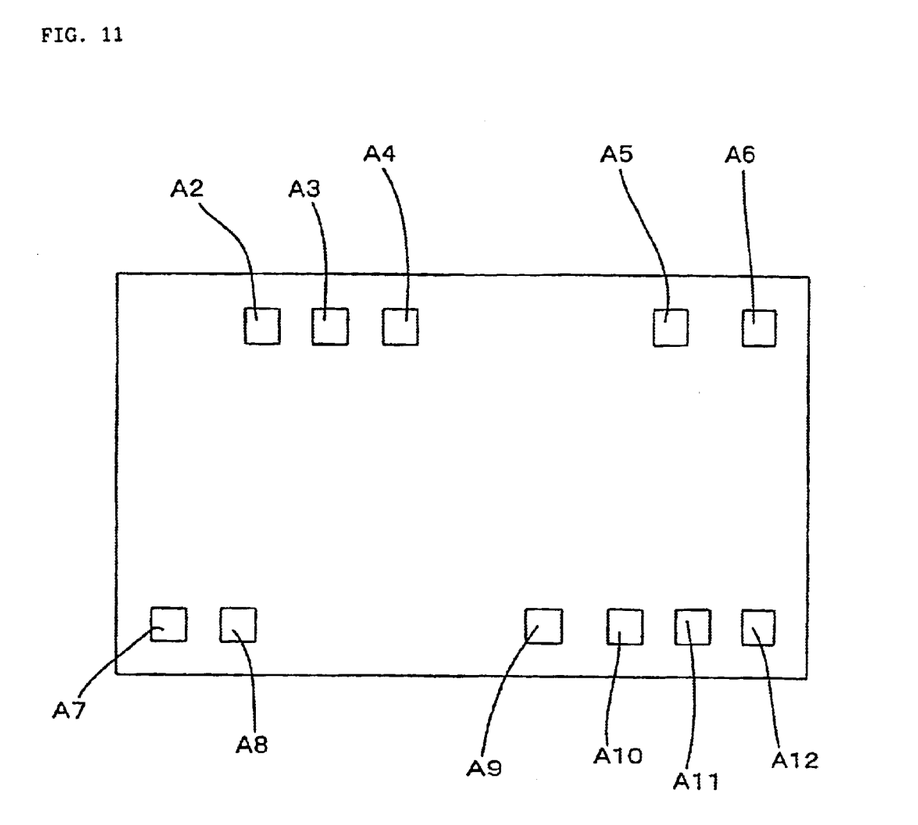
FIG. 11 is a view for illustrating the positional relationships between connecting terminals of an IC chip shown in FIG. 5 and various function terminals.

In FIGS. 4, 9 and 11, symbols A2 to A12 individually designate connecting terminals of an IC chip 14 (FIG. 3). Wiring electrodes are arranged so that the terminal A2, among these connecting terminals, is connected to AFC, A3 to XTAL2, A4 to BB, A5 to VSS, and A6 to EE (reference voltage output PAD). Further, the terminal A7 is connected to XTAL-A, A8 to VDD, A9 to AA, A10 to CC, A11 to DD, and A12 to CSOUT.

As shown in FIG. 4, the terminals 131 for connecting projecting electrodes 13, electrodes for external connection, are exposed near the four corners of the lower surface of the fourth ceramic sheet 5, individually.

A through hole 111 (FIG. 7) that is formed in the second ceramic sheet 3 is connected electrically to a crystal oscillator connecting terminal (input-side) pattern (XTAL-A pattern) A7 (FIG. 9) through a through hole 121 (FIG. 9) in the third ceramic sheet 4. Further, a through hole 112 that is formed in the second ceramic sheet 3 is connected electrically to a crystal oscillator connecting terminal (output-side) pattern (XTAL2 pattern) A3 (FIG. 9) through a through hole 122 in the third ceramic sheet 4. Furthermore, a through hole 113 (FIG. 7) that is formed in the second ceramic sheet 3 is connected electrically to the terminal VSS via the seam ring 6 and a through hole 123 (FIG. 8) in the third ceramic sheet 4 shown in FIG. 9. The EE electrode is electrically connected the VSS terminal through the through hole 124.

Figure 10:
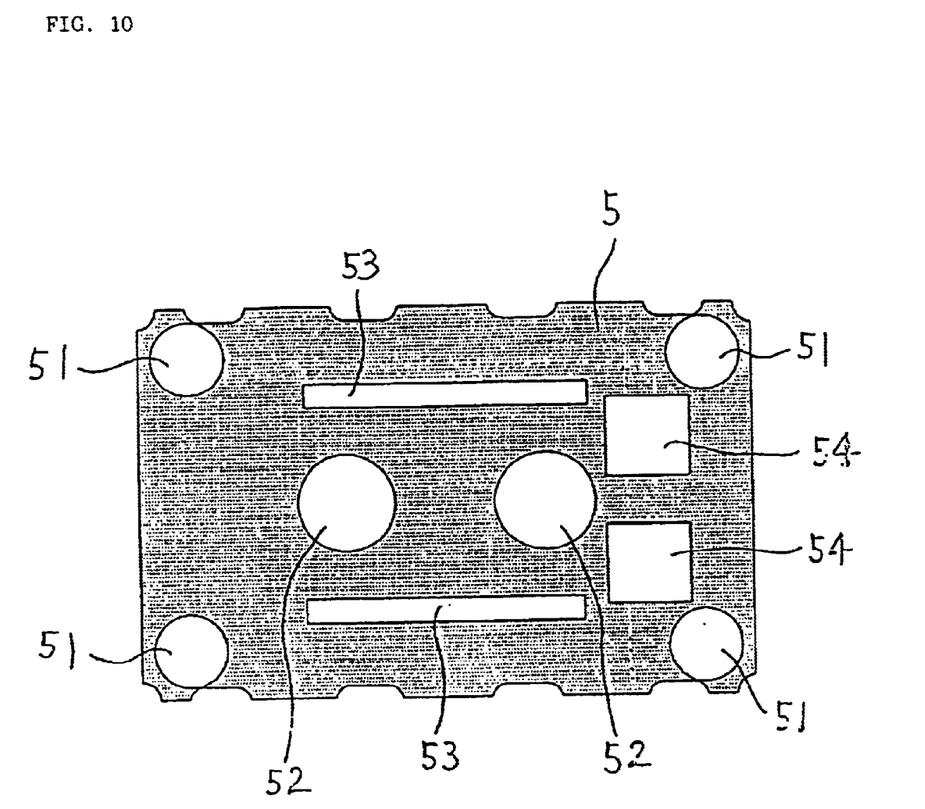
FIG. 10 is a plan view showing openings for the exposure of connecting terminals in a fourth ceramic sheet that constitutes the piezoelectric generator of FIG. 3.

As shown in FIG. 10, the fourth ceramic sheet 5 is formed having openings 51, through which the terminals of the projecting electrodes 13 (FIG. 3) are exposed near its four corners, and openings 52, through which the crystal oscillator connecting terminal (input- and output-side) patterns A7 and A3, for use as electrodes for input and output inspection for the crystal oscillator 8 as a simple, are partially exposed substantially on the center line of the mounting area of the crystal oscillator 8. The fourth ceramic sheet 5 further has two openings 53 (FIG. 4) through which the terminal group including the IC chip connecting terminals A2 to A6 and the group including the connecting terminals A7 to A17, which are situated around the opposite end portions of the mounting area of the crystal oscillator with the openings 52 between them, are exposed, and two openings 54 through which connecting terminals of a capacitor 17 (FIG. 3) are exposed near one end portion of the mounting area of the crystal oscillator. Other wiring patterns are covered with the fourth ceramic sheet 4 to be protected.

Figure 5:
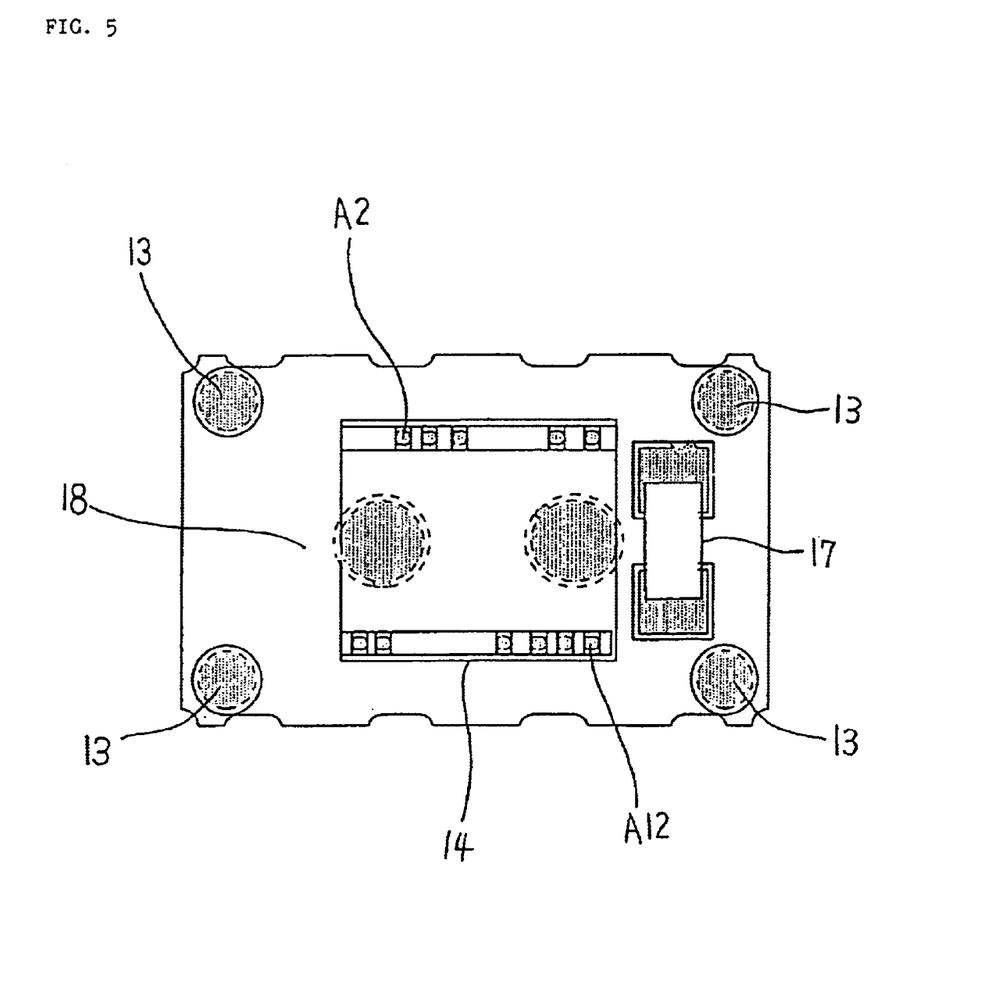
FIG. 5 is a bottom view of the piezoelectric generator (mounted with electronic components) of FIG. 3.

As shown in FIG. 5, the projecting electrodes 13 are provided individually near the four corners of the lower surface of the multi-layer substrate 1. The electrodes 13 are electrodes for external connection, which serve to connect the substrate 1 to a motherboard or the like. Each projecting electrode 13 is ball-shaped electrode formed of a solder ball. These projecting electrodes 13 are formed like respectively independent legs.

A small copper ball may be embedded in solder to form a ball-shaped electrode.

As shown in FIG. 3, the height of the projecting electrodes 13 is greater than that of the electronic components (IC chip 14 and capacitor 17) mounted on the fourth ceramic sheet 5. Even if the solder flows when mounting the projecting electrodes 13 on the motherboard by soldering, therefore, a short circuit can be prevented from occurring between the electrode terminals for adjustment formed on the outer peripheral wall surface of the multi-layer substrate 1. If a copper ball is embedded in solder, the copper ball serves as a spacer, thus completely preventing the IC chip 14 and the capacitor 17 from contacting with the motherboard.

As shown in FIG. 3, moreover, the IC chip 14 is set substantially on the central portion of the lower surface of the multi-layer substrate 1 by flip-chip mounting using solder bumps 15, and is sealed with a sealing resin 16. Further, the capacitor 17 is mounted adjacent to one side of the IC chip 14. The area on the other side of the IC chip 14 is left as a space area that is mounted with no electronic component. The space area on the side of IC chip 14 opposite the capacitor 17 is utilized as a resin injection area 18 through which the sealing resin 16 is injected to the IC chip 14 by means of a dispenser.

In the piezoelectric generator according to the embodiment described above, the crystal oscillator 8 is hermetically sealed on the upper surface side of the multi-layer substrate 1, and the IC chip 14 and the capacitor 17, electronic components, are mounted on the lower surface side of the substrate 1. This structure produces an effect such that no organic substance from the resin-based adhesive for electronic component fixation adheres to the crystal oscillator 8, so that the oscillation properties of the oscillator 8 never lower.

Further, as the piezoelectric generator can be mounted spaced from the motherboard, the projecting electrodes 13 that are arranged individually near the four corners of the multi-layer substrate 1 can prevent the occurrence of a short circuit between the electrode terminals for adjustment on the outer peripheral wall surface of the substrate 1 that is attributable to a solder flow caused when the piezoelectric generator is mounted on the motherboard or the like.

The capacitor 17 is mounted on the lower surface of the multi-layer substrate 1 so as to adjoin only the one side of the IC chip 14 that is flip-chip-mounted on the substantially central portion of the lower surface of the substrate 1, so that the resin injection area 18 is formed on the other side of the chip 14. Thus, the resin can be easily injected into the active area of the IC chip 14.

If the IC chip 14 is so small that a wide space area is formed around it, or a capacitor is incorporated into the IC chip 14, the sealing resin can be injected by utilizing an area that adjoins two sides of the IC chip.

Since the crystal oscillator 8 and the electronic components (IC chip 14 and capacitor 17) are stored in a single container, moreover, the thickness of the piezoelectric generator can be reduced.

Although the electronic components of the piezoelectric generator according to the present embodiment are composed of the one IC chip and the one capacitor, they need not always be composed of these elements. For example, the electronic components may be formed of two IC chips for generator and memory circuits without using a capacitor. The IC chip for the memory circuit may be replaced with an IC chip for a frequency divider circuit or PLL circuit. The memory circuit can be stored with temperature compensation data for the crystal oscillator 8 and the like.

Depending on the desired function, moreover, the electronic component may be composed of a resistor, coil, variable capacitor, diode, or IC chip only.

Figure 12:
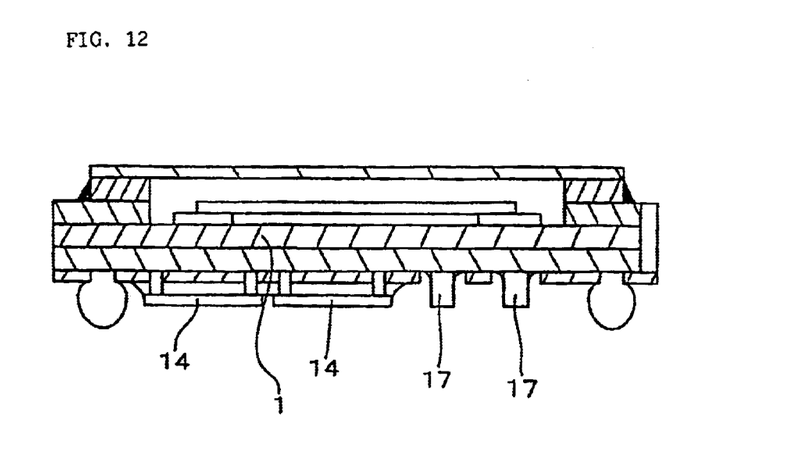
FIG. 12 is a sectional view of a piezoelectric generator according to a second embodiment of the invention.

A second embodiment of the present invention will now be described with reference to FIG. 12.

In this embodiment, electronic components are formed of a plurality of types of elements or a communication of IC chips. FIG. 12 shows a case where electronic components are formed of two IC chips 14 and two capacitors 17. An electronic-component-free area is provided on one side of the IC chips 14, and is utilized as a resin injection area through which a sealing resin is injected to the IC chips 14 by means of a dispenser.

It is only necessary to first set electronic components meeting desired functions, the shape and size of those electronic components, and the size of a multi-layer substrate adapted to the number of components and then determine the respective mounting positions of the electronic components and the resin injection region. In the case where only one IC chip is mounted, the resin injection area may be secured in a manner such that the IC chip is located eccentrically to the multi-layer substrate.

In the foregoing embodiment, moreover, the projecting electrodes are formed as the electrodes for external connection of the piezoelectric generator. However, the present invention is not limited to this embodiment, and projecting electrodes may be formed in advance on the motherboard on which the piezoelectric generator is mounted. Further, the projecting electrodes are not limited in number, and electronic components may share the projecting electrodes.

A third embodiment of the present invention will now be described with reference to FIG. 13. The same reference numerals are used for component parts identical with those in the foregoing embodiments, and a repeated description of those elements is omitted.

Figure 13:
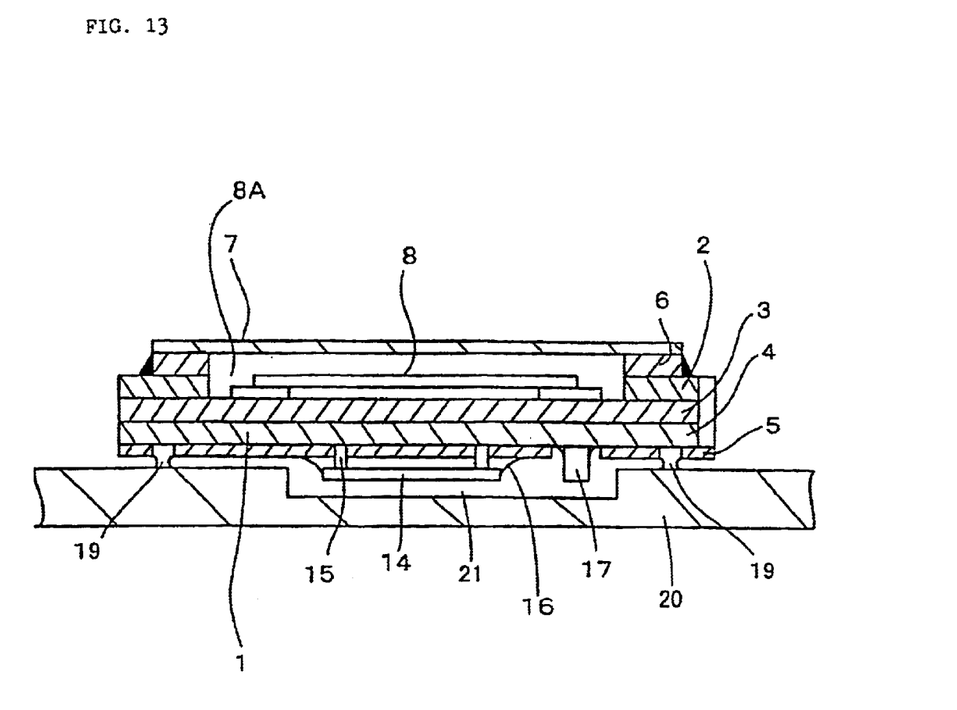
FIG. 13 is a view for illustrating a structure for mounting a piezoelectric generator according to a third embodiment of the invention on a mountable substrate.

As shown in FIG. 13, electrodes 19 for external connection of a piezoelectric generator are connected individually to electrodes (not shown) of a mountable substrate 20 for use as a motherboard. In this state, the length of downward projection of the electrodes 19 from a multi-layer substrate 1 is shorter than the length of downward projection (mounting height) of electronic components (IC chip 14 and capacitor 17). However, the mountable substrate 20 is provided with a recess 21 as a storage portion for partially storing the IC chip 14 and the capacitor 17, so that the IC chip 14 and the capacitor 17 never come into contact with the substrate 20. Thus, the piezoelectric generator can be thinned. The recess 21 of the mountable substrate 20, which serves as the electronic component storage portion, may be replaced with a through hole.

A fourth embodiment of the present invention will now be described with reference to FIGS. 14 to 17.

In the piezoelectric generator of the first embodiment described with reference to FIG. 3, the substrate that constitutes the container in which the crystal oscillator 8 is enclosed is formed of the ceramic sheets that are joined in layers. According to the present embodiment, on the other hand, the substrate is formed of a simple ceramic plate. The following is a description of the construction of a piezoelectric generator according to this embodiment.

Figure 15:
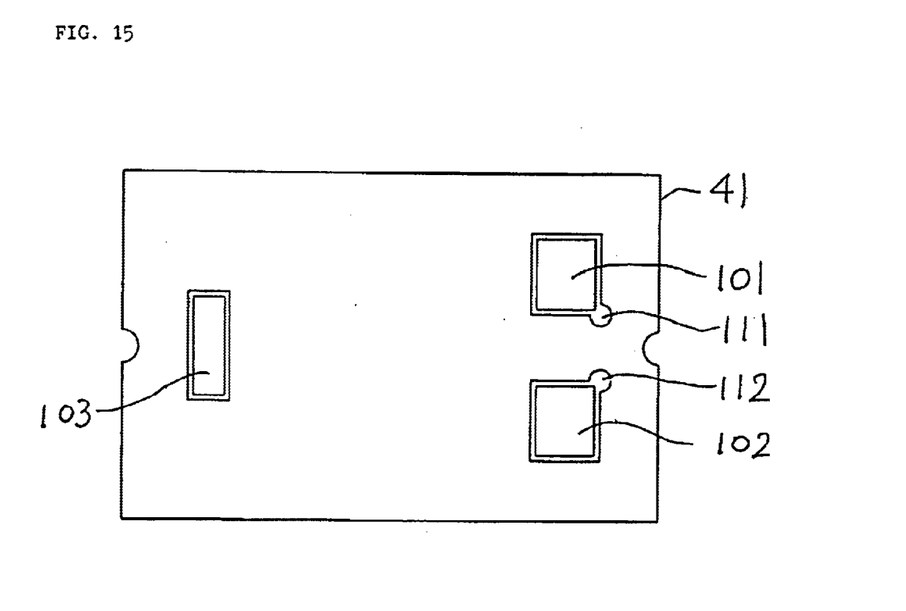
FIG. 15 is a top view of a substrate that constitutes the piezoelectric generator of FIG. 14.

As shown in the plan view of FIG. 15, a simple ceramic substrate 41 is a substantially rectangular flat plate. A pair of electrodes 101 and 102 for carrying a crystal oscillator 8 thereon are formed on one end portion of the upper surface of the substrate 41, and a receiving portion 103 for the crystal oscillator 8 is formed on the other end portion. In FIG. 15, numerals 111 and 112 denote through holes (electrodes), individually. The electrodes 101 and 102 are formed by printing two layers of tungsten, as the same way in the forgoing embodiments. As the printing area in the upper layer is smaller than that in the lower layer, the printing in the upper layer gets necessarily on the printing in the lower layer, even though the printing position in the upper layer has got out of position slightly.

Figure 14:
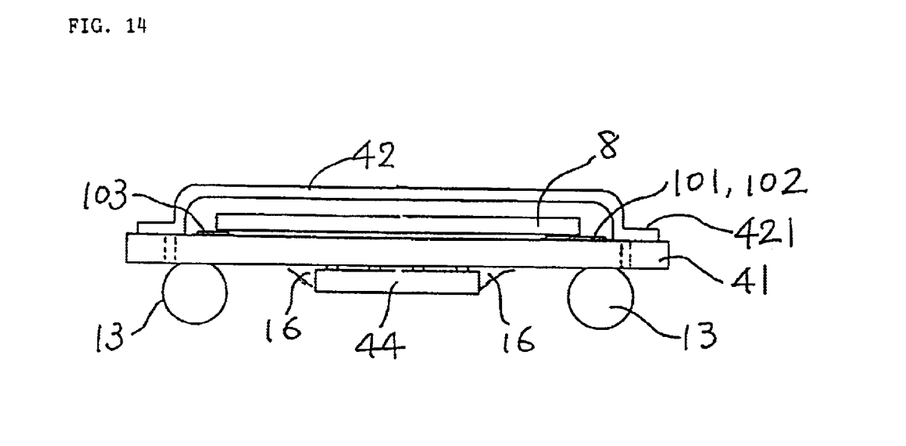
FIG. 14 is a sectional view of a piezoelectric generator according to a fourth embodiment of the invention.

After the crystal oscillator 8 is fixed on the electrodes 101 and 102 and the electrode receiving portion 103, a metallic cap 42 is put on the upper surface of the substrate 41, and its skirt portion 421 is seamlessly welded to the upper surface of the substrate 41, as shown in FIG. 14. Thereupon, a space in which the crystal oscillator 8 is to be hermetically sealed is defined between the cap 42 and the substrate 41.

Figure 16:
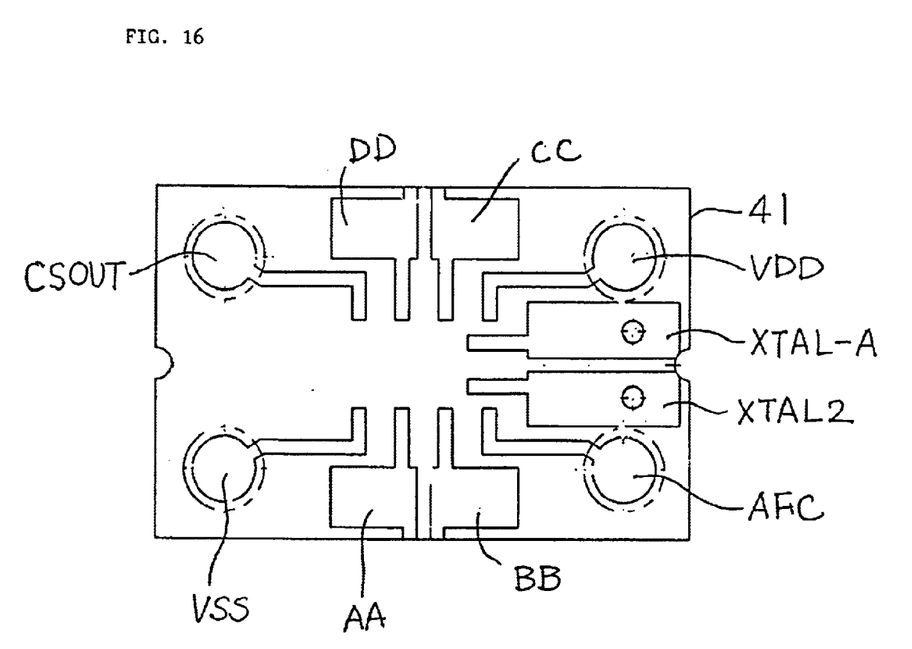
FIG. 16 is a view showing electrode patterns formed on the lower surface of the substrate of FIG. 15.

As shown in FIG. 16, electrode patterns for various electrode terminals are formed on the lower surface of the substrate 41. Among these electrode terminals, VDD (positive power terminal), VSS (negative power terminal), CSOUT (oscillation waveform output terminal), and AFC (AFC control voltage connecting terminal for externally applying voltage signals for frequency regulation) are terminals a user or purchaser of the piezoelectric generator uses. Further, AA (clock input terminal), BB (data output terminal), CC (output terminal for various analog signals), and DD (chip select input terminal) are adjusting terminals for temperature compensation data the manufacturer of the generator uses. Furthermore, XTAL-A is a crystal oscillator connecting terminals (input side), while XTAL2 is a crystal oscillator connecting terminal (output side).

Figure 17:
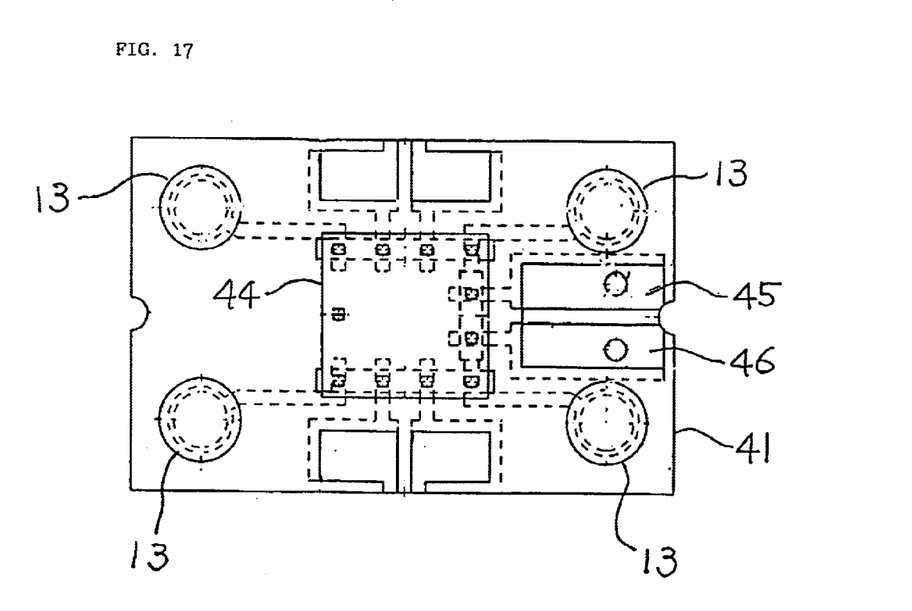
FIG. 17 is a view showing a state in which an IC chip for use as an electronic component is mounted on the lower surface of the substrate of FIG. 15 (connecting terminal patterns are indicated by dotted lines for simplicity of illustration).

As shown in FIG. 17, an IC chip 44 is mounted substantially in the central portion of the lower surface of the substrate 41, and is sealed with a sealing resin 16 (FIG. 14). In this embodiment, an electronic component is formed of the IC chip only and includes no capacitor (capacitor is incorporated in the IC chip 44). Various terminals, except for connecting terminals of the IC chip 44, are protected with alumina coating (not shown).

Terminals 45 and 46 (FIG. 17) for inspecting the crystal oscillator 8 are connected to the oscillator 8 through the through holes 111 and 112 (FIG. 15) in the substrate 41 and the electrode patterns of XTAL-A and XTAL2. If the through holes 111 and 112 in the substrate 41 are situated in the position where the substrate 41 and the skirt portion 421 of the cap 42 are joined overlapping each other, passage of air from or to a crystal oscillator storage space through the holes 111 and 112 is prevented, so that the space can be easily kept airtight. This cannot be achieved if the through holes are situated in any region where the substrate 41 and the skirt portion of the cap 42 do not overlap each other.

The piezoelectric generator according to this embodiment differs from the piezoelectric generator according to the first embodiment shown in FIG. 3 only in that its substrate that constitutes the container has a simple structure, not laminate, so that it can produce substantially the same effects with the piezoelectric generator of FIG. 3.

Thus, the present embodiment is also designed so that the crystal oscillator 8 is hermetically sealed on the upper surface side of the substrate 41 and that the IC chip 44 as an electronic component is mounted on the lower surface side of the substrate 41. This structure produces an effect such that no organic substance from the resin-based adhesive for electronic component fixation adheres to the crystal oscillator 8, so that the oscillation properties of the oscillator 8 never lower.

Further, projecting electrodes 13 that are arranged individually near the four corners of the substrate 41 can prevent the occurrence of a short circuit between electrode terminals for adjustment on the outer peripheral wall surface of the substrate 41 that is attributable to a solder flow caused when the piezoelectric generator is mounted on the motherboard or the like, as the piezoelectric generator can be mounted spaced from the motherboard.

On the lower surface of the substrate 41, furthermore, an area wide enough for the injection of the resin 16 can be secured around the IC chip 44, so that the sealing resin 16 can be easily injected into the active area of the chip 44.

The piezoelectric generator according to the present invention may be designed as follows.

The container is composed of a multi-layer substrate having a recess for the storage of the piezoelectric oscillator and a lid member fixed to the multi-layer substrate so as to cover the recess, and the electronic component and the electrodes for external connection are provided on the surface of the multi-layer substrate on the side opposite the lid member.

The multi-layer substrate has a substantially quadrangular shape, and the electrodes for external connection are arranged near the four corners of the multi-layer substrate, individually.

The electrodes for external connection are projecting electrodes having a height greater than the mounting height of the electronic component. The electronic component is composed of an IC chip and a capacitor.

The IC chip is mounted substantially on the central portion the multi-layer substrate. The capacitor is mounted adjacent to one side of the IC chip, and an injection area for a sealing resin is provided on the other side of the IC chip.

The sealing resin for the IC chip is injected from the side of an area on which the capacitor is not mounted.

The multi-layer substrate has an inspection terminal for the piezoelectric oscillator in a position within the IC chip mounting area and off connecting terminals of the IC chip.

The piezoelectric oscillator is a crystal oscillator.

The outer peripheral sidewall surface of the multi-layer substrate is provided with terminals for adjustment.

The electrodes for external connection of the piezoelectric generator are connected to a mountable substrate, which is provided with a storage portion for storing at least a part of the electronic component.

A piezoelectric generator in another aspect of the present invention comprises a container including a metallic cap put on the upper surface of a substrate in the form of a flat plate, the cap having a skirt portion bonded to the substrate so as to define a space in which a crystal oscillator is to be sealed between the substrate and the cap, the crystal oscillator placed on the upper surface of the substrate in the container, electrodes for external connection arranged on the peripheral portion of the lower surface of the substrate, and an electronic component mounted on the lower surface of the substrate.

Further, this piezoelectric generator may be designed as follows.

The electrodes for external connection are arranged so as to project downward from the lower surface of the substrate.

The electrodes for external connection project from the quadrangular substrate so as to be located below the electronic component mounted on the substrate.

Each of the electrodes for external connection is a ball-shaped electrode formed of a solder ball.

The electronic component is composed of an IC chip only.

The surface of the container is provided with crystal oscillator connecting terminals, and through holes formed in the substrate to connect the crystal oscillator connecting terminals and the crystal oscillator are situated in a region where the cap is superposed on and bonded to the substrate.

According to the piezoelectric generator of the present invention, as described above, there is no possibility of any organic substance from the resin-based adhesive for electronic component fixation adhering to the crystal oscillator. Moreover, the resin can be easily injected when mounting the IC chip. Further, a short circuit across the electrodes that is attributable to a solder flow can be avoided when the piezoelectric generator is soldered to the motherboard or the like. Thus, there may be provided a thinned high-reliability piezoelectric generator with satisfactory oscillation properties.

What is claimed is:

1. A piezoelectric generator, comprising:

a package substrate having an upper face and a lower surface;

a piezoelectric oscillator located on the upper face of said package substrate;

a lid member fixed to said package substrate in a manner such that it covers said piezoelectric oscillator;

an electric component mounted on the lower surface of said package substrate; and a plurality of electrodes for external connection independently protruding from the lower surface of said package substrate;

wherein each of said electrodes for external connection are made of solder and have a height greater than the mounting height of said electronic component.

2. The piezoelectric generator according to claim 1, wherein said package substrate is a multi-layer substrate.

3. The piezoelectric generator according to claim 2, wherein said multi-layer substrate has a recess in which the piezoelectric oscillator is stored.

4. The piezoelectric generator according to claim 1, wherein said package substrate comprises a flat plate.

5. The piezoelectric generator according to claim 1, wherein a through hole for connecting the piezoelectric oscillator to a corresponding connecting terminal is formed in said package substrate in a region where the lid member is superposed on and bonded to the package substrate.

6. The piezoelectric generator according to claim 1, wherein said package has a quadrangular shape, and said electrodes for external connection are arranged near the four corners of the package substrate, respectively, and said electronic component is arranged at the center of the package substrate.

7. The piezoelectric generator according to claim 1, wherein each of said electrodes for external connection comprises a solder ball.

8. The piezoelectric generator according to claim 7, wherein said solder ball includes an interior spacer.

9. The piezoelectric generator according to claim 8, wherein said interior spacer is a copper ball.

10. The piezoelectric generator according to claim 1, wherein said electronic component is an IC chip.

11. The piezoelectric generator according to claim 1, wherein said electronic component comprises an IC chip and a capacitor.

12. A piezoelectric generator apparatus comprising:

a piezoelectric generator; and a mountable substrate on which the piezoelectric generator is mounted, wherein said piezoelectric generator includes:
a package substrate having an upper face and a lower surface;
a piezoelectric oscillator located on the upper face of said package substrate;
a lid member fixed to said package substrate in a manner such that it covers said piezoelectric oscillator;
an electronic component mounted on the lower surface of said package substrate; and
a plurality of electrodes for external connection made of solder and protruding from the lower surface of said package substrate, formed like respectively independent legs;
wherein said electronic component is housed in a space whose upper part, side parts and lower part are defined by the package substrate, the electrodes for external connection made of solder, and the mountable substrate, respectively.

13. The mounting structure for a piezoelectric generator according to claim 12, wherein said electrodes for external connection comprise a solder ball.

14. The mounting for a piezoelectric generator according to claim 13, wherein said solder ball includes an interior spacer.

15. The mounting structure for a piezoelectric generator according to claim 14, wherein said spacer is a copper ball.

16. The mounting structure for a piezoelectric generator according to claim 12, wherein said electronic component is an IC chip.

17. The mounting structure for a piezoelectric generator according to claim 12, wherein said electronic component includes an IC chip and capacitor.

18. A piezoelectric generator apparatus comprising:
a piezoelectric generator, and
a mountable substrate on which the piezoelectric generator is mounted,
wherein said piezoelectric generator includes:
a package substrate;
a piezoelectric oscillator held on the side of the upper face of said package substrate;
a lid member fixed to said package substrate in a manner such that it covers said piezoelectric oscillator;
an electronic component mounted on the lower surface of said package substrate; and
a plurality of electrodes for external connection, protruding from the lower face of said package substrate, formed like respectively independent legs;
wherein said mountable substrate has a recess or through hole which allows at least a part of the electronic component to be stored when said piezoelectric generator is mounted on the mountable substrate.

* * * * *